(12) United States Patent
Sullivan

(10) Patent No.: US 7,327,783 B2
(45) Date of Patent: *Feb. 5, 2008

(54) FREQUENCY TRANSLATOR USING A CORDIC PHASE ROTATOR

(75) Inventor: Mark C. Sullivan, Annandale, VA (US)

(73) Assignee: SkyBitz, Inc., Sterling, VA (US)

( * ) Notice: Subject to any disclaimer, the term of this patent is extended or adjusted under 35 U.S.C. 154(b) by 26 days.

This patent is subject to a terminal disclaimer.

(21) Appl. No.: 11/345,671

(22) Filed: Feb. 2, 2006

(65) Prior Publication Data

US 2006/0233284 A1    Oct. 19, 2006

Related U.S. Application Data

(63) Continuation of application No. 09/925,011, filed on Aug. 9, 2001, now Pat. No. 7,020,190.

(60) Provisional application No. 60/223,972, filed on Aug. 9, 2000.

(51) Int. Cl.
  *H04B 1/38* (2006.01)
(52) U.S. Cl. .................. 375/222; 708/160; 708/622
(58) Field of Classification Search ................ 375/222, 375/322, 343, 371, 303; 708/160, 622, 404, 708/530, 422
See application file for complete search history.

(56) References Cited

U.S. PATENT DOCUMENTS

| | | | |
|---|---|---|---|
| 3,976,869 A | 8/1976 | Stella et al. | |
| 4,338,675 A | 7/1982 | Palmer et al. | |
| 4,893,316 A | 1/1990 | Janc et al. | |
| 4,896,287 A | 1/1990 | O'Donnell et al. | |
| 4,945,505 A | 7/1990 | Wiener et al. | |
| RE33,629 E | 7/1991 | Palmer et al. | |
| 5,365,516 A | 11/1994 | Jandrell | |
| 5,459,473 A | 10/1995 | Dempster et al. | |
| 5,488,588 A * | 1/1996 | Engeler et al. | ................ 367/7 |
| 5,557,637 A | 9/1996 | Glynn | |
| 5,689,270 A | 11/1997 | Kelley et al. | |
| 5,852,604 A | 12/1998 | Cooley et al. | |
| 5,955,986 A | 9/1999 | Sullivan | |
| 5,963,157 A | 10/1999 | Smith | |
| 6,208,290 B1 | 3/2001 | Krasner | |
| 6,249,245 B1 | 6/2001 | Watters et al. | |
| 6,522,176 B1 | 2/2003 | Davis | |
| 6,693,970 B2 | 2/2004 | Vankka | |
| 7,020,190 B2 | 3/2006 | Sullivan | |
| 2004/0039761 A1 * | 2/2004 | Wechel et al. | .............. 708/160 |

* cited by examiner

*Primary Examiner*—Temesghen Ghebretinsae
(74) *Attorney, Agent, or Firm*—Duane S. Kobayashi

(57) ABSTRACT

A frequency translator uses a CORDIC phase rotator coupled to a phase accumulator to translate an input signal in frequency. The CORDIC phase rotator performs required phase angle rotations of input vectors using only shift and add operations. Thus, the frequency translator can be readily implemented in hardware. Higher precision arithmetic is used in the CORDIC phase rotator operations than the input vectors contain. To avoid truncation error at the output of the CORDIC phase rotator, stochastic rounding is employed. A dither signal is added to avoid errors due to nonlinear operation of D/A converters, where D/A conversion of the frequency translated signal is required.

8 Claims, 8 Drawing Sheets

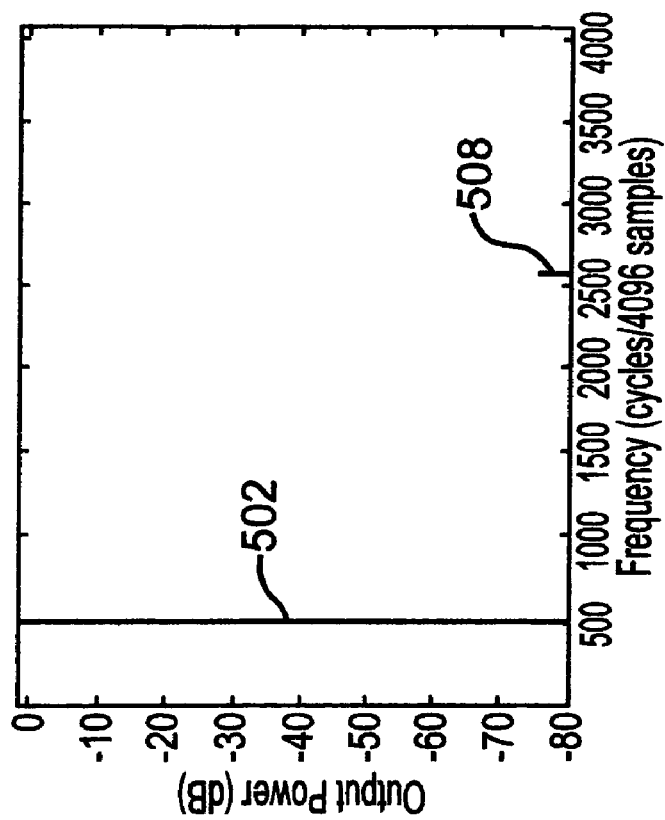
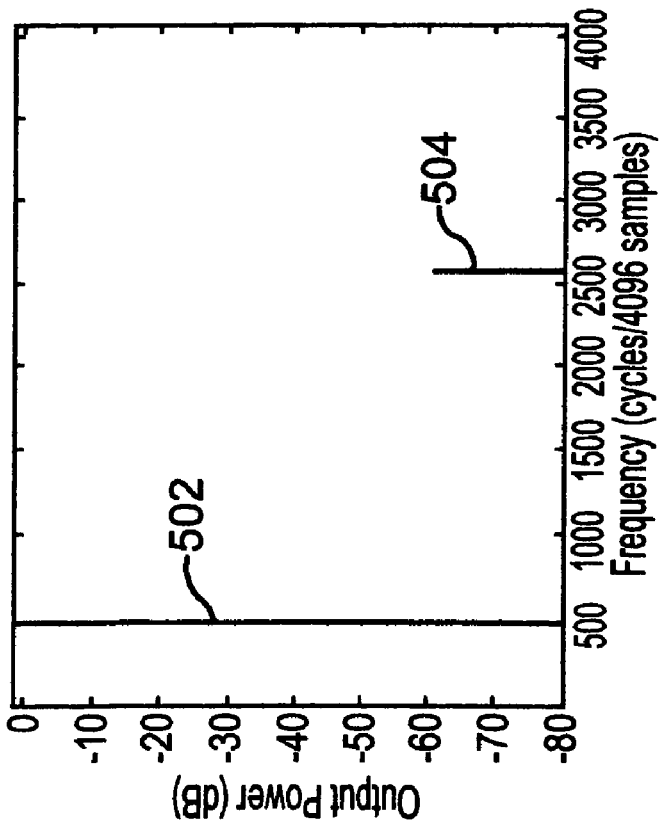

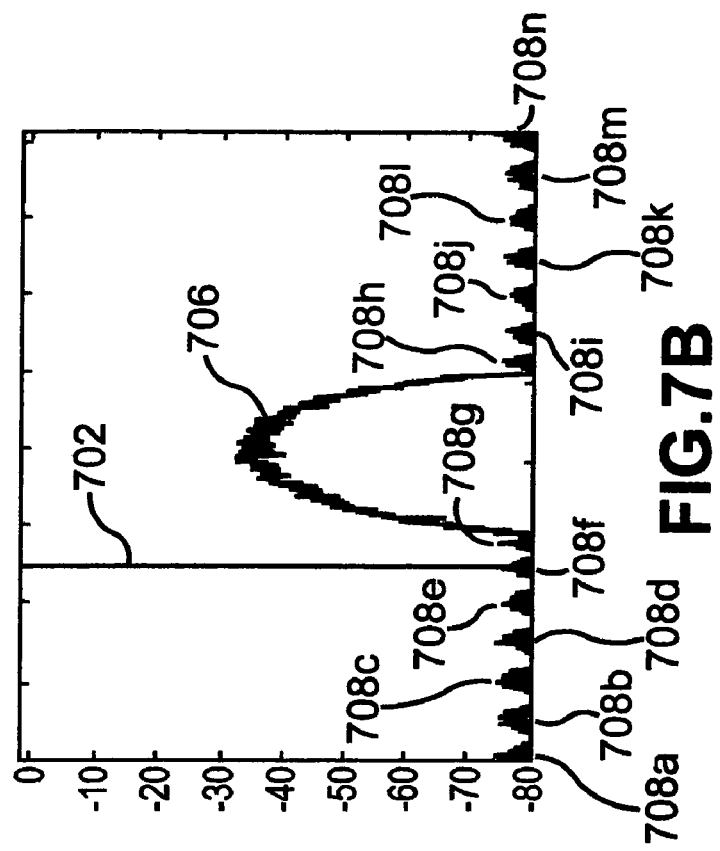
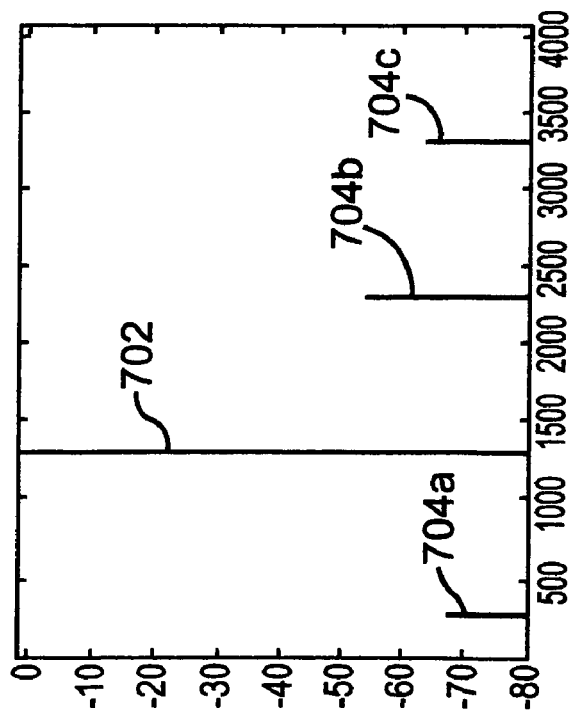

FREQUENCY TRANSLATOR USING A CORDIC PHASE ROTATOR

This application is a continuation of application Ser. No. 09/925,011, filed Aug. 9, 2001 now U.S. Pat. No. 7,020,190. The present application also claims priority to provisional application No. 60/223,972, filed Aug. 9, 2000. Each above-identified application is incorporated by reference herein, in its entirety, for all purposes.

BACKGROUND

1. Field of the Invention

The present invention relates generally to frequency translation. More specifically, the present invention relates to frequency translation in a communication system that can be easily implemented in digital hardware. The present invention further relates to use of frequency translators in numerous applications, including upconverting baseband signals to RF frequencies for transmission through modems, correcting for local oscillator offsets and FSK modulation.

2. Introduction

Frequency translation is required for numerous applications. For example, transmission of a baseband signal through a modem requires that the baseband signal be upconverted to a suitable transmission frequency. For another example, in wireless modem applications, suitable transmission frequencies are in the RF range. RF synthesizers exist to generate such frequencies. However, generally they are tuned to operate at frequencies separated by discrete steps. Due to the difficulty of designing RF synthesizers with small step values without severely degrading performance due to phase noise (i.e., distortion), RF transmitters use large steps between RF frequencies. Thus, it may be difficult to obtain an arbitrary RF frequency using an RF synthesizer.

Another problem with frequency synthesis arises from the use of local oscillators. Local oscillators are often inaccurate. While the amount of inaccuracy can be determined through calibration, tuning the oscillator to compensate for the inaccuracy is challenging. Further, if the oscillator is not properly tuned, the application in which the oscillator is being used may not function properly.

As digital processors become more powerful, functions traditionally performed by analog radio frequency (RF) circuitry are migrating to digital hardware and software. One such function is frequency translation. FIG. 1 is a schematic diagram of a conventional frequency translator. A phase accumulator 102 outputs a phase angle θ. Phase accumulator 102 is stepped by a phase increment Δθ. in an iterative manner. Thus, phase accumulator 102 increments by phase increment Δθ on each iteration. The size of the phase increment Δθ determines the corresponding frequency. Phase angle θ is used as an index into a sin/cos lookup table 104. The output of sin/cos lookup table is a complex value $e^{j\theta}$. The output of sin/cos table 104 provides one input to a complex multiplier. The other input of the complex multiplier is the signal, X, that is to be translated in frequency. The output of the complex multiplier at each iteration k is $Y_k = e^{jk\Delta\theta} \cdot X_k$. Thus, output Y corresponds to input X shifted in frequency by an amount proportional to phase increment Δθ. Phase accumulator 102 and sin/cos table 104 comprise what is commonly referred to as a numerically controlled oscillator (NCO) 107.

SUMMARY

The present invention replaces the numerically controlled oscillator of conventional frequency translators with a CORDIC phase rotator. A phase accumulator, coupled to the CORDIC phase rotator is initialized with the desired phase angle of rotation. The CORDIC phase rotator rotates an input vector by the phase angle of rotation (or a close approximation thereto) using only shift and add functions. This enables the present invention to be readily implemented in hardware using, for example, an application specific integrated circuit (ASIC). Further, the CORDIC phase rotator can be implemented as a pipeline of stages, each stage adding or subtracting a portion of the phase angle of rotation.

In addition, the present invention applies stochastic (probabilistic) rounding to the output of the CORDIC processor to minimize truncation noise. Stochastic rounding is accomplished by adding a 4-bit pseudo random number, generated by a 4-bit pseudo random number generator to the least significant 4 bits of the output of CORDIC phase rotator. The carry of that addition is added to the 10 most significant bits of the CORDIC phase rotator.

Further, when the signal is to be applied to a component that exhibits a nonlinearity such as a D/A converter, the present invention applies a dithering technique to the rounded signal to compensate for the nonlinearity. A dither signal is generated by a 1-bit random number generator. The signal so generated is filtered by a transversal low pass filter (LPF) to concentrated the energy of the dither signal near zero frequency. The filtered dither signal is added to the signal to be converted to analog.

The dither signal is removed from the resulting analog signal in two ways. First, the aliasing characteristics inherent in D/A converter operation removes some of the dither signal. Second, band pass filtering removes a substantial portion of any dither signal that remains.

The present invention is described in greater detail in the detailed description of the invention, the appended drawings and the attached claims.

BRIEF DESCRIPTION OF THE DRAWINGS

FIG. 5A is a frequency domain plot illustrating truncation noise.

FIG. 5B is a frequency domain plot illustrating truncation noise reduction using stochastic rounding.

FIG. 7A is a frequency domain plot illustrating harmonics created due to D/A converter non-linearity.

FIG. 7B is a frequency domain plot illustrating reduction of harmonics created by D/A converter nonlinearities using a dither signal.

DETAILED DESCRIPTION

The present invention optimizes hardware frequency translation by performing frequency translation using only shift and add operations. In addition, the present invention overcomes the problems associated with RF synthesizers that have wide steps. The RF synthesizer can be used to get close to the desired frequency, and the present invention can add any fine tuning required to generate a desired frequency. For example, the present invention can tune in 1 Hz steps, which is difficult to accomplish using an RF synthesizer. Similarly, the present invention can be used to compensate for offsets in local oscillator frequencies. This is accomplished by calibrating the local oscillator to determine the offset and then using the present invention to translate the oscillator-generated frequency to compensate for the offset.

The present invention can also be used as a frequency modulator. For example, to perform FSK modulation, a carrier frequency applied to the present invention is shifted in frequency depending on the value of the applied bit stream. In a similar manner, the present invention can be used to perform frequency hopping.

Figure 1:
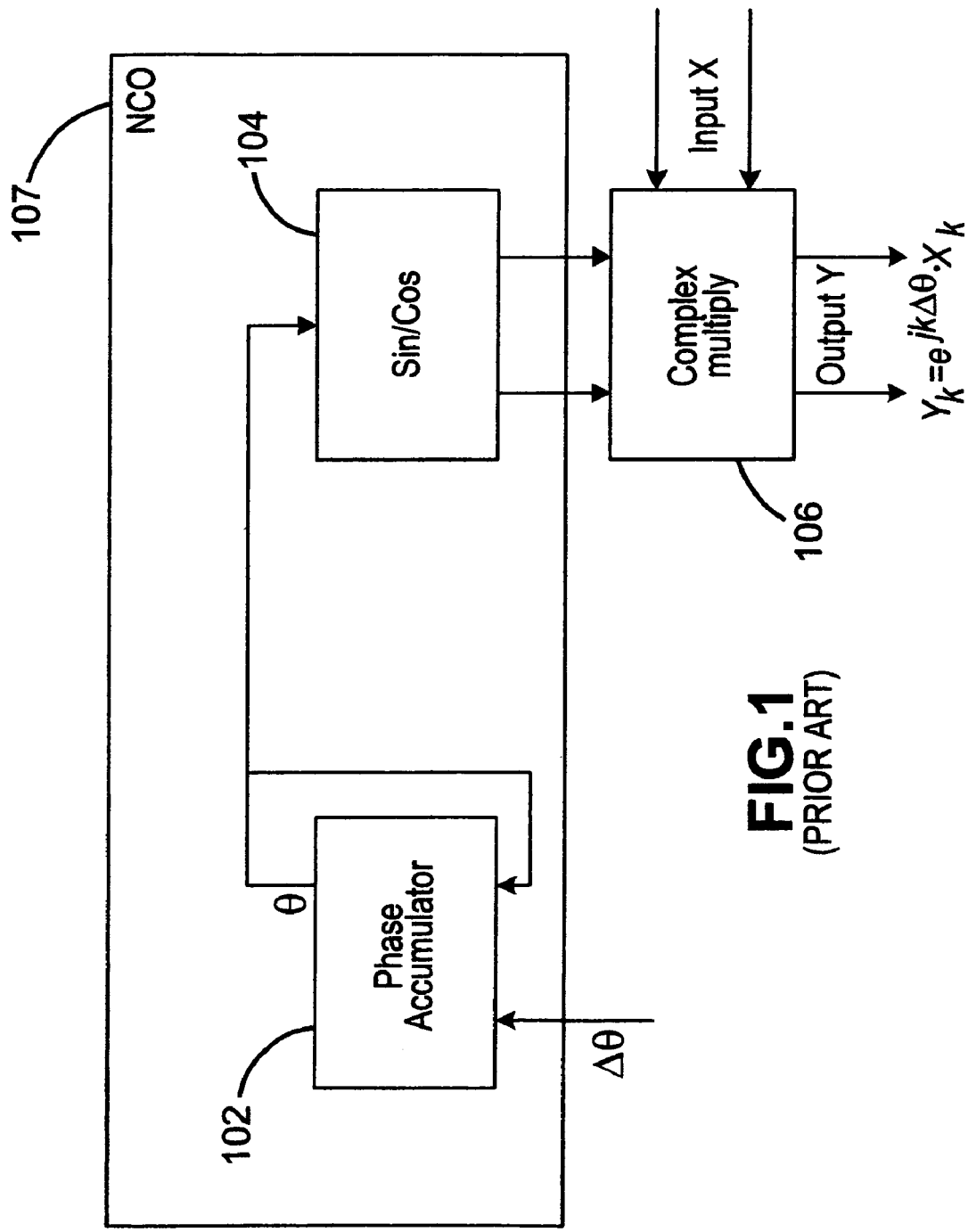
FIG. 1 is a schematic diagram of a conventional frequency translator.
Figure 2:
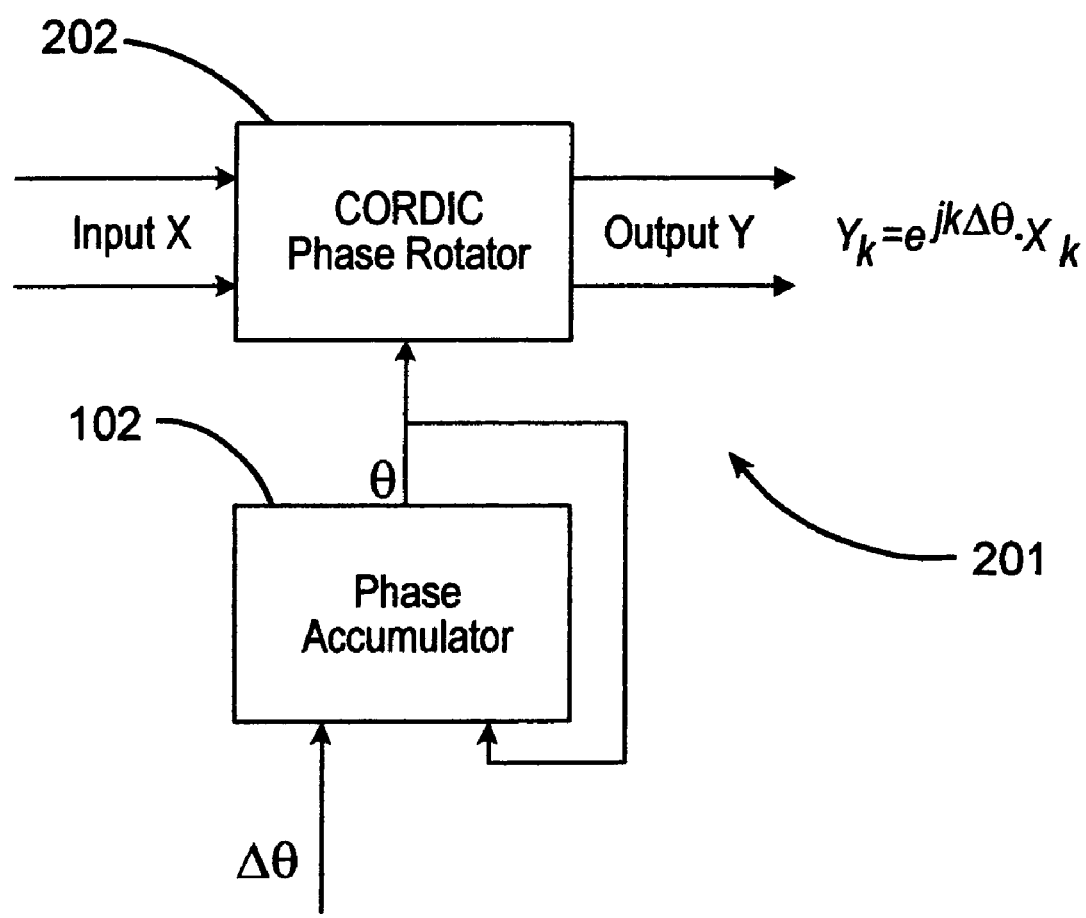
FIG. 2 is a schematic diagram of a frequency translator according to a first embodiment of the present invention.

FIG. 2 is a schematic diagram of a frequency translator 201 according to a first embodiment of the present invention. In FIG. 2 phase accumulator 102 outputs a phase angle to a CORDIC phase rotator 202. CORDIC phase rotator rotates an input X by a phase angle $\theta$. The output Y can be expressed as $Y_k = e^{jk\Delta\theta} \cdot X_k$, which is equivalent to the output of conventional frequency translators. However, in frequency translator 201 of the present invention, sin/cos table 104 and complex multiplier 106 are replaced by CORDIC phase rotator 202.

The Coordinate Rotation Digital Computer (CORDIC) is a well-known algorithm, which was developed in the 1950s, and is described in Andraka, Ray, "A survey of CORDIC algorithms for FPGA based computers," Proceedings of the 1998 ACM/SIGDA 6.sup.th International symposium on FPGAs, Feb. 22-24, 1998, Monterey, Calif., pp. 191-200. The advantage of CORDIC phase rotator 202 is that it uses discrete logic rather than multipliers and lookup tables as required for operation of NCOs. Thus, computationally efficient shift and add operations replace more computationally intensive multiplies. As a consequence, CORDIC phase rotator 202 can be implemented in pipelined hardware for maximum speed.

In essence, the CORDIC phase rotator performs a rotation using a series of specific incremental rotation angles selected so that each is performed by a shift and add operation. The operation of CORDIC phase rotator 202 is described in more detail below.

Rotating a complex vector by a phase angle .theta. can be accomplished by multiplying the complex vector by a rotation matrix:

$$A(\theta) = \begin{bmatrix} \cos\theta & -\sin\theta \\ \sin\theta & \cos\theta \end{bmatrix}.$$

Through basic trigonometric substitution, $A(\theta)$ can be represented as:

$$A(\theta) = \frac{1}{\sqrt{1+\tan^2\theta}} \begin{bmatrix} 1 & -\tan\theta \\ \tan\theta & \cos\theta \end{bmatrix}.$$

By restricting the value of phase angle $\theta$ to arctangent of 2 to some power (i.e., $\theta_k = \tan^{-1}(2^{-k})$, where k is any integer), $A(\theta)$ can be advantageously written as:

$$A(\theta_k) = \frac{1}{\sqrt{1+2^{-2k}}} \begin{bmatrix} 1 & -2^{-k} \\ 2^{-k} & 1 \end{bmatrix}, A(-\theta_k) = \frac{1}{\sqrt{1+2^{-2k}}} \begin{bmatrix} 1 & 2^{-k} \\ -2^{-k} & 1 \end{bmatrix} \quad (1)$$

Positive or negative rotations can be performed as described below. The $$\frac{1}{\sqrt{1+2^{-2k}}}$$

value is a scale factor for the CORDIC algorithm. The scale factor can be disregarded for most applications. Its only effect is to provide some gain to the CORDIC algorithm. As can be seen, using the CORDIC algorithm allows vector rotation using only shifts and adds, provided rotation angles are restricted as provide above. Thus, for each k, the input vector X is rotated by an angle equal to $\tan^{-1}(2^{-k})$.

By cascading the rotation matrices, rotations of arbitrary angles (or close approximations thereto) can be obtained. The desired angle of rotation can then be obtained by appropriate combination of sums and differences of the angles by which each stage can rotate its input. For example, to rotate an input vector by 45 degrees, a rotation matrix that rotates the input vector by 15 degrees can be cascaded with a rotation matrix that rotates the input vector by 30 degrees. Thus, rotation by an arbitrary angle (or a close approximation thereto) is accomplished by the relationship $A(\theta)X \approx A(\pm\theta_1)A(\pm\theta_2) \ldots A(\pm\theta_n)X$. In this relationship successive stages of the cascade rotate the vector input to that stage in a positive or negative direction depending upon the value of $\theta$ for that stage.

Figure 3:
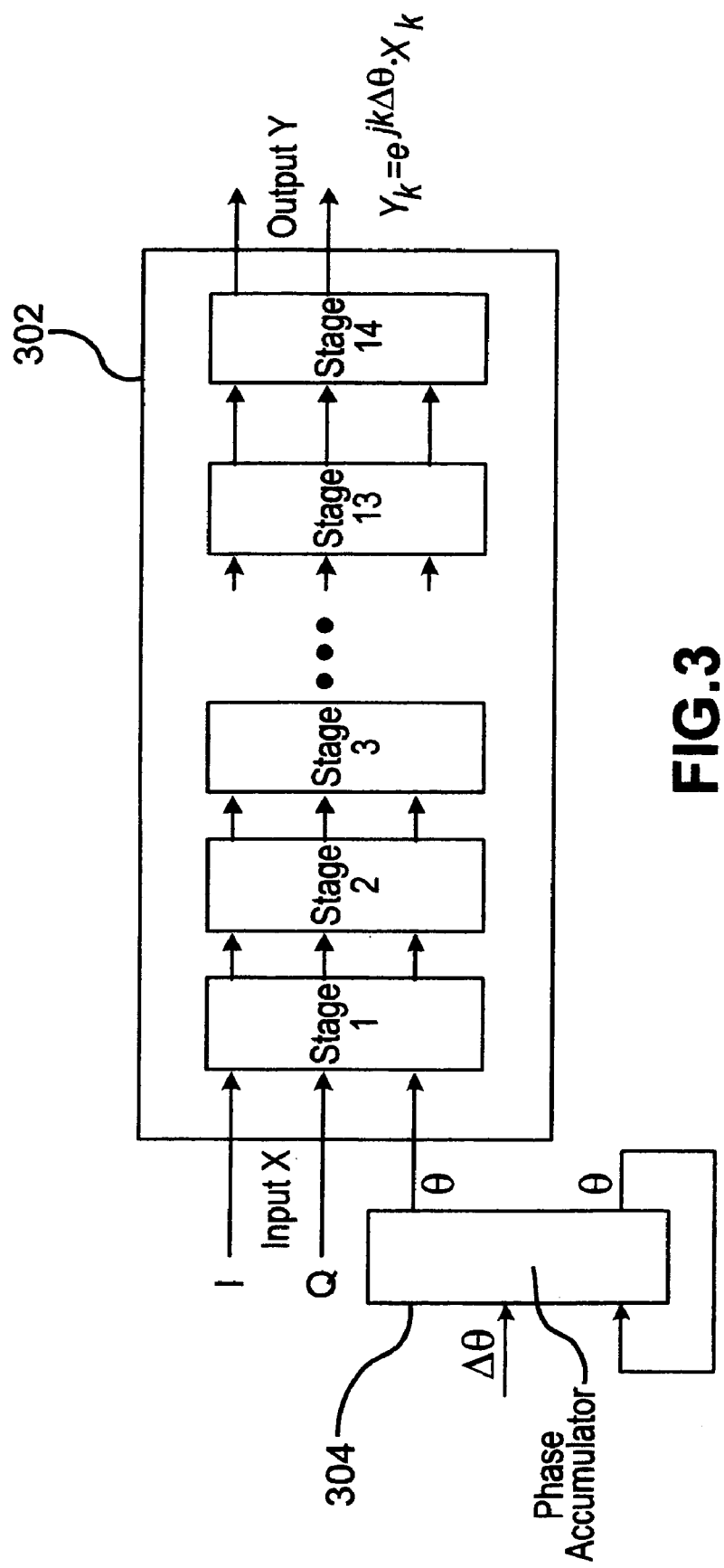
FIG. 3 is a schematic diagram of a frequency translator according to a second embodiment of the present invention.

FIG. 3 is a frequency translator according to a second embodiment of the present invention using a 14-stage CORDIC phase rotator. An input vector X is to be rotated by a phase angle $\theta$. The inphase (I) and quadrature (Q) components of input vector X are input to a CORDIC phase rotator 302. In the preferred embodiment, CORDIC phase rotator 302 comprises 14 stages, stage 1 through stage 14. Stages 2 through 14 input the inphase and quadrature components of a vector rotated by the previous stage and output a vector rotated in according to the relation $\theta_k = \tan^{-1}(2^{-k})$ where k is the stage number and $\theta_k$ is the amount of rotation provided by that stage. If $\theta_k$ is negative, the angle is rotated in the negative direction for that stage. In addition, each of these stages outputs an adjusted phase angle. The phase angle is adjusted to account for the rotation provided by that stage. This can be either a positive or negative adjustment depending on the sign of the phase angle input to the stage. For example, if the desired rotation is 38 degrees and stage 1 rotates the input vector by 25 degrees, then stage 1 outputs a phase angle of 13 degrees to stage 2. If stage 2, rotates the angle by 15 degrees, then stage 2 outputs a phase angle of −2 to stage 3. In this example, stage 3 then rotates its input vector in the negative direction and adds the amount of rotation to the phase angle.

More or fewer stages can be used in CORDIC phase rotator 302 depending on the accuracy desired for arbitrary rotation phase angles. Stage 1 inputs the input vector X and the user entered or predetermined phase angle $\theta$. Stage 14 inputs the preceding stage's vector and rotates it by an amount equal to ±θ$_{14}$. Stage 14 outputs the input vector X rotated by approximately the phase angle θ. Preferably, each stage uses 14-bit arithmetic for operations on the I and Q inputs and 12-bit arithmetic for operations involving phase angle θ.

The angle of rotation (phase angle θ) is provided by phase accumulator 304. The angle of rotation can be a predetermined angle or user entered. At each stage the input vector is rotated in a positive or negative direction so that the total rotation at the output of the 14$^{th}$ stage is equal to or approximately equal to the desired angle of rotation. In addition, the phase angle output by each stage is the phase angle input to that stage adjusted to account for the rotation provided by that stage. As described above, the process of rotation using the CORDIC algorithm is reduced to a series of shifts and adds.

Figure 4:
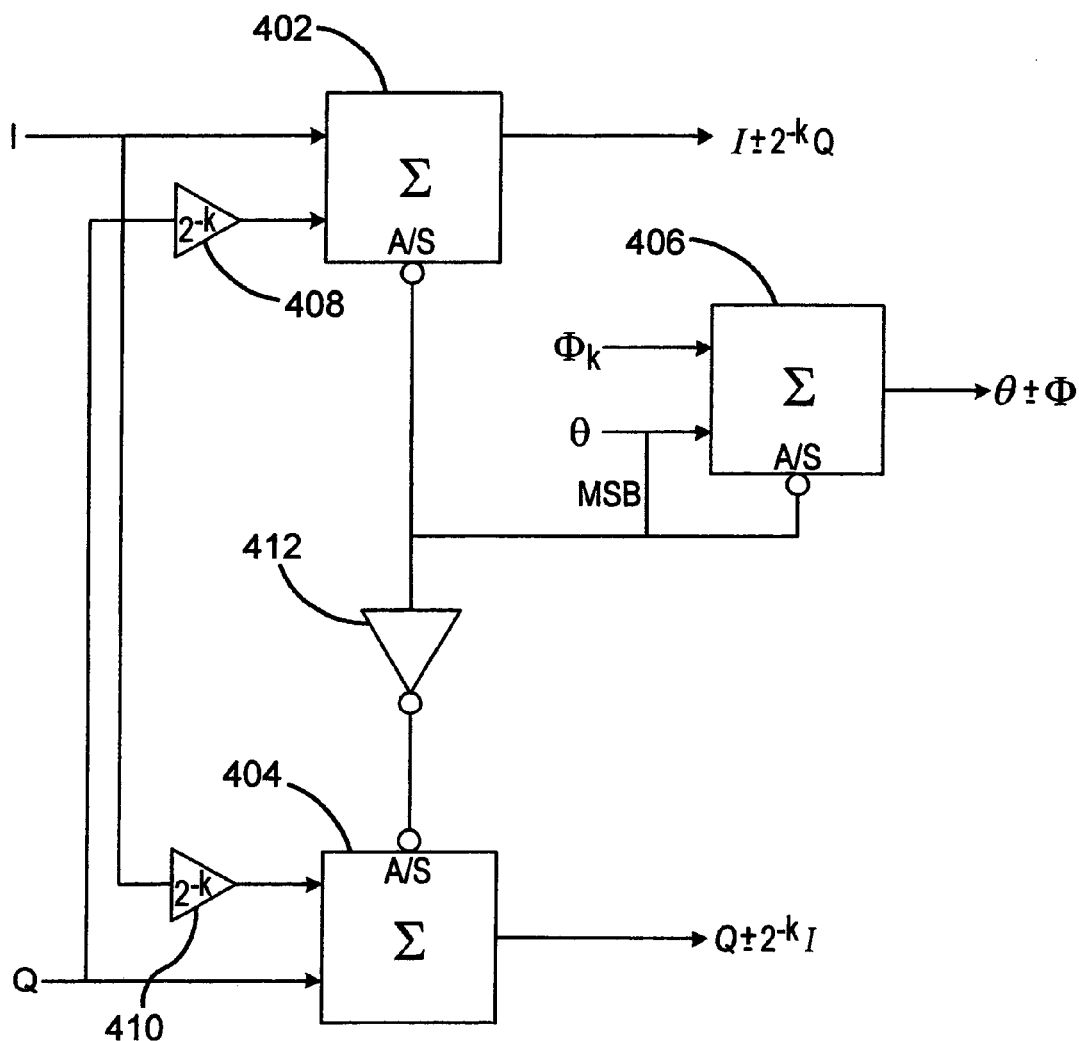
FIG. 4 is a schematic diagram of an exemplary stage of a CORDIC phase rotator.

FIG. 4 is a schematic diagram of an exemplary stage of CORDIC phase rotator 302 to more clearly illustrate the required shifts and adds. Each stage comprises three adders 402, 404 and 406. Adder 402 produces the quantity I±2$^{-k}$Q. This is the I term provided to the subsequent stage. Adder 404 produces the quantity Q±2$^{-k}$I. This is the Q term provided to the subsequent stage. The quantity I±jQ output by stage 14 represents the input I±jQ rotated by phase angle θ (or a close approximation thereto).

It would be apparent to those skilled in the art that the I and Q terms multiplied by the 2$^{-k}$ is equivalent to a right shift of the respective I or Q term by k places. As described above, k is equal to the stage number. The shift is represented in FIG. 4 by shift operators 408 and 410. Shifting operations can be performed efficiently in digital hardware.

Adder 406 outputs the phase angle to input to the next stage. This phase angle is the sum of the input phase angle and the angle supplied by that stage (i.e., the phase angle adjustment described above). The output of adder 406 is minimized. Thus, whether to add or subtract a stage's phase angle is controlled by the most significant bit (MSB) of the phase angle input to that stage. As is well known to those skilled in the art, the MSB indicates whether the value is positive (corresponding to an MSB of 0) or negative (corresponding to an MSB of 1). Consequently, if the phase angle input to a stage is positive, the rotation angle provided by that stage is subtracted from the phase angle input that stage. Conversely, if the phase angle input to a stage is negative, the rotation angle provided by that stage is added to the phase angle input that stage. The output of adder 406, θ±φ$_k$, (where θ is the phase angle input to a stage and k is the angle that the k$^{th}$ stage corresponds to) is passed to the next stage as the next stage's input phase angle.

The MSB of the phase angle input to a particular stage is used to control whether adders 402 and 404 add or subtract their inputs. This follows from the relationships represented by equation (1) above. Inverter 412 is used to maintain the relationship of equation (1).

One concern with using CORDIC is spurious outputs. If 10 bits are used to represent the in-phase and quadrature portions of the input signal, then it is undesirable to use 10-bit arithmetic operations to perform the shift and adds described above. One reason is that simply shifting values to the right is effectively a truncation of the rightmost bits of the value. Truncation adds error that can be avoided. As is well known, this error manifests itself as spurious noise in the spectrum of the output of a process employing truncation. For example, FIG. 5A illustrates an exemplary spectrum of a 500 Hz sine wave generated by truncating to 10 bits. Spike 502 corresponds to the power in the sine wave at 500 Hz. However, there is also a significant spike 504 observed at 2500 Hz. Spike 504 represents truncation noise.

The present invention removes the contribution of spurious noise by using more precision to perform the arithmetic required for the CORDIC phase rotator than the input precision. For example, in the present invention, the input signal has a precision of 10 bits, but 14 bits of precision are used in the arithmetic required for the CORDIC phase rotator. This technique reduces truncation error for 10 bits of precision if ensuing operations retain the higher precision, i.e., continue to use 14 bits of precision.

However, not all applications retain such precision. For example, if a 10-bit D/A converter follows the CORDIC phase rotator, the 14 bits must be truncated to 10 bits. This results in truncation error as described above.

Figure 6:
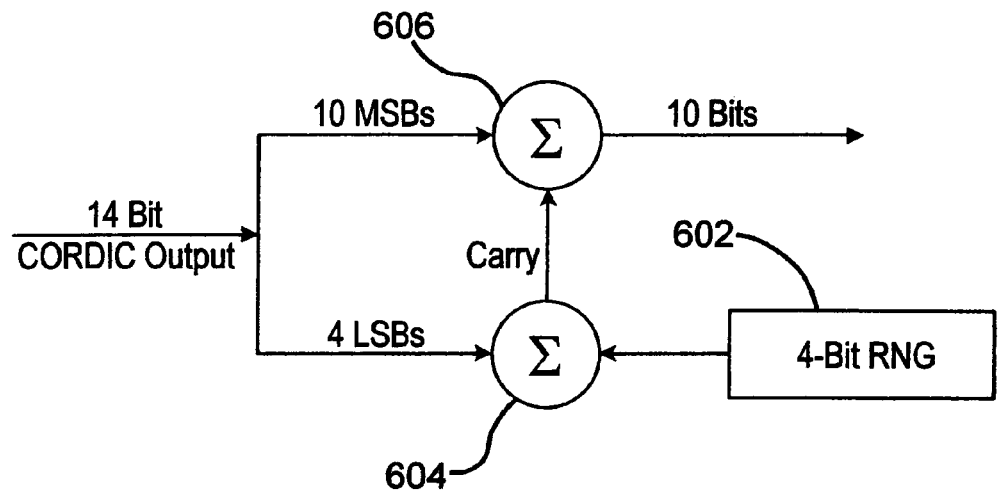
FIG. 6 is a schematic diagram of an apparatus for performing stochastic rounding.

FIG. 6 is a schematic diagram of an apparatus for reducing the error due to truncation through randomization of the error using stochastic rounding. The apparatus illustrated in FIG. 6 can also be implemented as a method as would be apparent to those skilled in the art. In the present case, truncation from 14 bits to 10 bits is required, but the technique described can be extended as required for a particular implementation. A 4-bit random number generator (RNG) 602 generates a 4-bit random number. The 4-bit random number is added to the 4 least significant bits (LSBs) of the output of the CORDIC phase rotator in adder 604. The carry bit is added to the 10 MSBs of the 14-bit number output by the CORDIC phase rotator in adder 606. The result of the addition performed by adder 606 is taken as the 10-bit output value of the CORDIC phase rotator.

The rounding apparatus illustrated in FIG. 6 performs a stochastic (probabilistic) rounding function. Thus, the expected value of the output of the function is equal to the input. That is, the average error at the output of the function is 0. Thus, while truncation noise has not been completely eliminated, it has been significantly reduced, and spread out, rather than being concentrated.

FIG. 5B illustrates reduction of spurious noise by using the apparatus described in FIG. 6. In this case, a spurious peak 508 at approximately 2500 Hz is significantly reduced as compared to the corresponding spurious peak 504 in FIG. 5A, where only truncation is used.

The signal that has been generated at the output of the CORDIC phase rotator is translated in frequency. It can now be input into a D/A converter, for example, to generate a signal suitable for transmission by a modem. However, D/A converters are not ideal. One aspect of the non-ideal nature of D/A converters is a non-linear response to an input. Consequently, if a sine wave is input to a D/A converter, it will include undesired harmonics of the sine wave frequency. FIG. 7A is an exemplary spectrum of an output of a D/A converter when a sine wave is input to it. The sine wave has a frequency of approximately 1300 Hz as shown by the largest peak 702. However, undesirable harmonics 704a, 704b and 704c are clearly evident.

Figure 8:
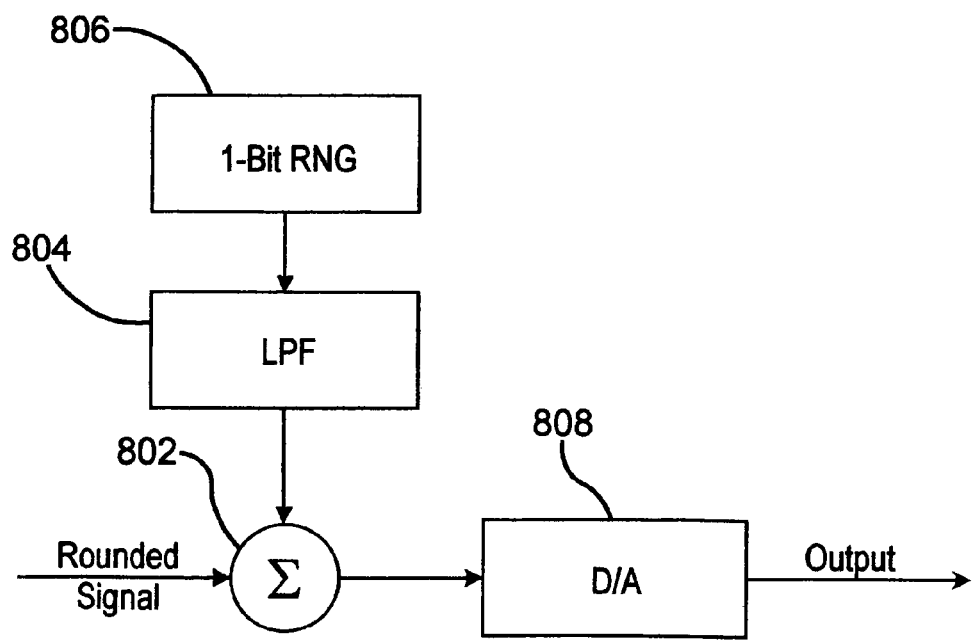
FIG. 8 is a schematic diagram of an apparatus for adding a dither signal to a signal to compensate for D/A converter non-linearity.

FIG. 8 illustrates a schematic diagram of an apparatus for largely eliminating the harmonics caused by the D/A nonlinearity typically present in most D/A converters. The apparatus of FIG. 8 can also be implemented as a method as would be apparent to those skilled in the art. Using an adder 802, a random signal is added to the rounded signal data generated by the stochastic rounding process described above. The random signal is generated by a 1-bit random number generator (RNG) 806. The signal is bandlimited by filter 804 to a part of the frequency spectrum that will not be used. This allows the added random signal to be filtered out later. The technique illustrated in FIG. 8 is known as dithering. Like the rounding technique described above, dithering does not completely eliminate the error due to the nonlinearity, but rather, randomizes it.

LPF 804 is preferably a transversal filter. As is well-know, the output of a transversal filter is given by the relation, $$Y_k = \sum_{k=0}^{N} h_k X_{i-k},$$

where $h_k$ is the coefficient of the $k^{th}$ filter tap, and $X_{i-k}$ represents each successive bit of the 1-bit pseudo-random sequence generated by RNG 806. Using well-known techniques, the coefficients of the filter taps are chosen to bandlimit the broadband output of RNG 806 to a part of the frequency spectrum that is not used. As explained above, this allows the random (dither) signal to be filtered out later.

Filter 806 can be any filter. However, it is optimal to make filter 806 a low pass filter (LPF). This allows the random signal to be placed near zero frequency (i.e., DC). This is optimal because it enables the aliasing effect of a D/A converter, such as D/A converter 808, to effectively null out the random signal. The desired signal is optimally placed at ¼ of the sample rate.

FIG. 7B illustrates the frequency spectrum that results from the operation of the apparatus shown in FIG. 8. The spurious noise present at the harmonics has been effectively spread out over a large bandwidth. The desired signal energy is peak 702. The dither signal energy is distributed across the hump 706. The small noise humps 708a-n result from the sidebands of LPF 804. Choosing appropriate coefficients for LPF 804 can make hump 706 narrower and/or reduce the power in the sidebands 708a-n. For reasons described below, operation of LPF 804 centers the dither energy at approximately zero frequency.

Figure 9:
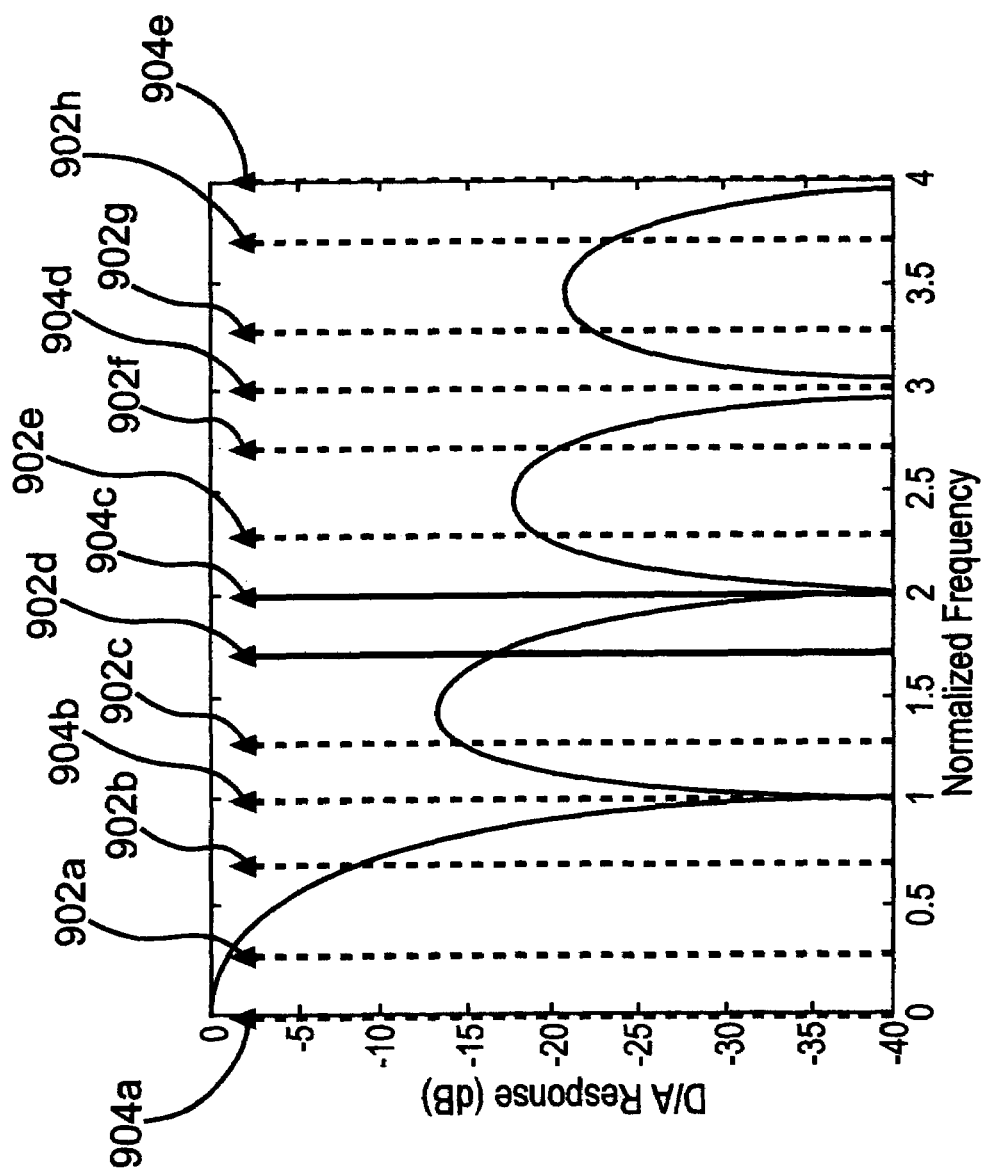
FIG. 9 is a frequency domain plot illustrating a nulling effect inherent in D/A converter operation.

FIG. 9 illustrates the nulling effect of the D/A converter. The desired signal 902a is placed a ¼ of the sample rate. FIG. 9 illustrates the sinx/x response of a typical D/A converter. Aliasing, inherent in D/A converter operation, causes images of the desired signal to be created. These are images 902b, 902c, 902d, 902e, 902f, 902g and 902h. As can be seen, placing desired signal 902 at approximately ¼ the sample rate places it near a peak in the sinx/x function of the D/A converter in each of the ensuing images. Thus, the image is not significantly attenuated.

The dither signal 904 is placed close to zero by operation of LPF 806. D/A converter aliasing also causes images of the dither signal to be created. These images are peaks 904b, 904c, 904d and 904e. It is apparent however, that the images of the dither signal appear at or very close to the nulls of the D/A converter's frequency response. Consequently, the dither signal is largely eliminated by the inherent nature of the D/A converter. As shown by hump 706 in FIG. 7B, the dither signal energy is wideband with a width depending on the cutoff frequency of filter 804. Consequently, some of its energy is likely to be present though severely attenuated by the sinx/x response of the D/A converter.

In modem applications, one of the images of the D/A converter is typically chosen for transmission. For example, if the sample rate is 18.432 MHz, the desired signal is placed at substantially 4.608 MHz (i.e., ¼ the sample rate). By operation of the D/A converter, an image suitable for transmission is present at 32.256 MHz by operation of the D/A converter. The corresponding dither signal image is at approximately 36.864 MHz, which is a null of the D/A converter frequency response for an 18.432 MHz sample rate. Consequently, the dither signal is largely eliminated in the ensuing transmission. A suitable analog bandpass filter can be designed to pass the desired signal after nulling by the D/A. For example, the image 902d can be used and the corresponding image of the dither signal 904c is largely suppressed by operation of the D/A converter.

The foregoing disclosure of the preferred embodiments of the present invention has been presented for purposes of illustration and description. It is not intended to be exhaustive or to limit the invention to the precise forms disclosed. Many variations and modifications of the embodiments described herein will be obvious to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A frequency translator, comprising:
   a CORDIC phase rotator that rotates an input signal by a phase angle of rotation using shift and add functions;
   a stochastic rounding apparatus that reduces error due to truncation of a result of higher precision arithmetic, said stochastic rounding apparatus including an adder that adds a multi-bit random number with truncated least significant bits of an output of said CORDIC phase rotator; and
   a dithering apparatus that eliminates harmonics caused by digital to analog converter non-linearity, including a second adder that adds a 1-bit random number with an output of said stochastic rounding apparatus, wherein an output of said second adder is provided to a digital to analog converter.

2. The frequency translator of claim 1, further comprising a low pass filter that filters said 1-bit random number prior to input to said second adder.

3. The frequency translator of claim 1, wherein said CORDIC phase includes N stages, each stage having an inphase (I) input, a quadrature (Q) input and a phase angle (q) input, each stage (k) further comprising a third adder to compute a quantity $I \pm 2^{-k} Q$, a fourth adder to compute a quantity $Q \pm 2^{-k} I$ and a fifth adder to compute $\theta \pm \phi_k$, where $\phi_k$ is an angle rotation of stage k, where each stage outputs the sum generated by each adder to be used as inputs to a succeeding stage, and wherein the Nth stage outputs an inphase component and a quadrature component from its third and fourth adders respectively that correspond to an input vector rotated by a desired phase angle.

4. A method for translating a signal in frequency, comprising:
   rotating an input signal by a phase angle of rotation using shift and add functions of a CORDIC phase rotator;

adding a multi-bit random number with truncated least significant bits of an output of said rotation and adding a carry bit produced by said adding of said multi-bit random number to the most significant bits of said rotation to produce a first output, thereby reducing error due to truncation of a result of higher precision arithmetic; and adding a 1-bit random number with said first output and providing a second output to a digital to analog converter, thereby eliminating harmonics caused by digital to analog converter non-linearity.

5. The method for claim 4, wherein said CORDIC phase rotator has N stages, further comprising:

calculating a quantity $I \pm 2^{-k} Q$ in each stage of the N-stage CORDIC phase rotator;

calculating a quantity $Q \pm 2^{-K} I$ in each stage of the N-stage CORDIC phase rotator;

calculating a quantity $\theta \pm \phi_k$ in each stage of the N-stage CORDIC phase rotator;

inputting to each successive stage of the N-stage CORDIC processor after the first stage an inphase (I) component, a quadrature (Q) component and phase angle $\theta$, each of which is output by the preceding stage;

inputting to a first stage of the N-stage CORDIC processor an inphase component and a quadrature component of a complex-valued sample of the signal to be translated in frequency, and a phase angle by which to rotate the complex-valued sample of the signal; and outputting from a last stage of the N-stage CORDIC processor an inphase component and a quadrature component of the complex-valued sample of the signal to be translated in frequency rotated by approximately the angle stored in the phase accumulator.

6. A method for transmitting a signal, comprising the steps of:

generating a digital representation of the signal to transmit;

applying successive complex-valued samples of the signal to a CORDIC phase rotator;

rotating each complex-valued sample by phase angle to achieve a desired frequency translation;

stochastically rounding the rotated complex-valued samples to reduce error due to truncation of a result of higher precision arithmetic, said stochastic rounding apparatus including an adder that adds a multi-bit random number with truncated least significant bits of an output of said CORDIC phase rotator;

adding a dither signal to the stochastically rounded samples to generate a transmission signal, wherein said dither signal is a 1-bit random number that eliminates harmonics caused by digital to analog converter non-linearity;

converting the transmission signal to an analog transmission signal; and transmitting the analog transmission signal.

7. The method of claim 6, wherein stochastic rounding is performed only if the CORDIC phase rotator use higher precision operations than subsequent processing operations.

8. The method of claim 6, further comprising removing the dither signal after converting the transmission signal to analog.

* * * * *